(12) United States Patent
Kobayashi (10) Patent No.: US 7,263,640 B2
(45) Date of Patent: Aug. 28, 2007

(54) LSI, TEST PATTERN GENERATING METHOD FOR SCAN PATH TEST, LSI INSPECTING METHOD, AND MULTICHIP MODULE

(75) Inventor: Takuya Kobayashi, Kawasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 87 days.

(21) Appl. No.: 11/293,166

(22) Filed: Dec. 5, 2005

(65) Prior Publication Data

US 2006/0125466 A1 Jun. 15, 2006

(30) Foreign Application Priority Data

Dec. 13, 2004 (JP) ............................ P2004-360180

(51) Int. Cl.
*G01R 31/28* (2006.01)
(52) U.S. Cl. ..................................... 714/726
(58) Field of Classification Search ............... None
See application file for complete search history.

(56) References Cited

U.S. PATENT DOCUMENTS 5,561,614 A * 10/1996 Revilla et al. ............ 702/120
6,405,335 B1 * 6/2002 Whetsel ..................... 714/726
6,972,598 B2 * 12/2005 Yoo ........................... 326/95
2002/0162065 A1 10/2002 Kashiwagi et al.

FOREIGN PATENT DOCUMENTS

| JP | 09-311157 | 12/1997 |
| JP | 2002-323540 | 11/2002 |
| JP | 2002-350505 | 12/2002 |

OTHER PUBLICATIONS

Abramovici et al.; *Digital Systems Testing and Testable Design*; pp. 364-366 and pp. 488-489.

* cited by examiner

*Primary Examiner*—Christine T. Tu
(74) *Attorney, Agent, or Firm*—McDermott, Will & Emery LLP (57) ABSTRACT

Registers 119 and 120 for power control or power-off signals in an LSI are set as a dedicated chain and a control signal can be controlled desirably from the outside so that the states of the registers 119 and 120 can be monitored easily. In a test pattern generating method for a scan path test, the relation between values of the registers for the power control or power-off and power supplies to be controlled is set as an option in order to control the registers 119 and 120 for the power control or power-off. In this manner, a pattern in which the power control function or the power-off function of the LSI is taken into consideration can be produced.

7 Claims, 9 Drawing Sheets

LSI, TEST PATTERN GENERATING METHOD FOR SCAN PATH TEST, LSI INSPECTING METHOD, AND MULTICHIP MODULE

BACKGROUND OF THE INVENTION

1. Field of the Invention

The present invention relates to an LSI (Large Scale Integrated Circuit), a test pattern generating method for a scan path test, an LSI inspecting method and a multichip module. Particularly the invention relates to a method for inspecting an LSI having a power control function or a power-off function, and a method for automatically generating a test pattern by a structured testing technique.

2. Description of the Related Art

In recent years, it has been popular to use structured tests for inspection of LSIs. Examples of the structured tests include a scan path test in which a pattern is generated easily, a BIST (Built In Self Test) in which a pattern is generated inside an LSI, etc. For example, these techniques are described in Miron Abrabmovici and two others, "DIGITAL SYSTEMS TESTING AND TESTABLE DESIGN", IEEE Press.

The structured testing techniques of LSIs according to the background art are circumstanced as follows. That is, in the techniques, it is assumed that power supplied to each LSI is constant in voltage from the start of a test to the end of the test. In recent years, however, LSIs often have a power control function or a power-off function. Thus, it is impossible to perform inspection including the power control function or the power-off function of each LSI.

SUMMARY OF THE INVENTION

The invention is achieved in consideration of the aforementioned circumstances of the background art. An object of the invention is to provide an LSI provided with a power control function or a power-off function, a test pattern generating method for a scan path test, an LSI inspecting method and a multichip module, in which inspection including the power control function or the power-off function of the LSI can be preformed.

The invention provides an LSI having a power control function or a power-off function, including: power terminals; ground terminals; registers connected as a scan chain and capable of holding power control information; a gate circuit capable of controlling a clock signal to be supplied to the registers; a clock control terminal capable of inputting a control signal for controlling the gate circuit; scan-in terminals capable of inputting scan signals; and scan-out terminals capable of outputting the scan signals. The LSI is characterized in that the control signal is supplied from the outside and the scan signals are monitored during a structured test.

According to this configuration, the registers for the power control or power-off signals are set as a dedicated chain and the control signal is controlled desirably from the outside so that the states of the registers can be monitored. Thus, inspection including the power control function or the power-off function of the LSI can be performed.

In addition, the invention provides a method for generating a test pattern for a scan path test on an LSI including power terminals and ground terminals and having a power control function or a power-off function. The method is characterized by including the step of generating a test pattern for testing the power control function or power-off function in accordance with power control information of the LSI stored in power control or power-off registers.

According to this configuration, the relation between values of power control or power-off registers and the power supplies to be controlled is included as an option in order to control the power control or power-off registers. Thus, it is possible to produce a pattern in which the power control function or the power-off function of the LSI is taken into consideration.

In addition, the invention provides a method for inspecting an LSI including power terminals, ground terminals, registers connected as a scan chain and capable of holding power control information, a gate circuit capable of controlling a clock signal to be supplied to the registers, a clock control terminal capable of inputting a control signal for controlling the gate circuit, scan-in terminals capable of inputting scan signals, and scan-out terminals capable of outputting the scan signals. The method is characterized by including the step of inspecting the LSI in a power control state or a power-off state on the basis of a test pattern for inspecting a power control function or a power-off function of the LSI.

According to this configuration, a test pattern generated by the test pattern generating method is used so that the LSI in the power control state or the power-off state can be inspected easily.

The method for inspecting an LSI according to the invention is also characterized in that the LSI is inspected by detecting an expected value corresponding to the power control information during a structured test.

According to this configuration, during inspection of the LSI, the registers for the power control signals are controlled desirably so as to set the state of a request of the LSI for power so that the power is supplied from the outside of the LSI in response to the register values. Thus, the LSI can be inspected while the power is supplied desirably during the structured test.

In addition, the method for inspecting an LSI according to the invention is also characterized by including an LSI inspection apparatus having: a power supply connected to the power terminals and the ground terminals so as to be capable of supplying power to the LSI; a signal driver connected to the scan-in terminals so as to be capable of supplying the scan signals to the scan-in terminals; and a signal comparator connected to the scan-out terminals so as to be capable of detecting the scan signals from the scan-out terminals.

In addition, the method for inspecting an LSI according to the invention is also characterized by including: a power supply module connected to the power terminals and the ground terminals so as to be capable of supplying power to the LSI; an LSI inspection board for mounting the power supply module and the LSI; and an LSI inspection apparatus having a power supply capable of supplying power to the power supply module, a signal driver connected to the scan-in terminals so as to be capable of supplying the scan signals to the scan-in terminals, and a signal comparator connected to the scan-out terminals so as to be capable of detecting the scan signals from the scan-out terminals.

In addition, the LSI according to the invention is also characterized by further including a power control module for power control or power-off; wherein the LSI can be inspected in a power control state or a power-off state by controlling the power control module during the structured test.

The invention also provides a multichip module including: an LSI having power terminals, ground terminals, registers connected as a scan chain and capable of holding power control information, a gate circuit capable of controlling a clock signal to be supplied to the registers, a clock control terminal capable of inputting a control signal for controlling the gate circuit, scan-in terminals capable of inputting scan signals, and scan-out terminals capable of outputting the scan signals; a power supply module for performing power control or power-off on the LSI; and a package on which the LSI and the power supply module are mounted. The multichip module is characterized in that the LSI can be inspected in a power control state or a power-off state by controlling the power supply module in the multichip module during a structured test.

As described above, according to the LSI, the test pattern generating method for the scan path test, the LSI inspecting method and the multichip module according to the invention, the registers for the power control or power-off signals are set as a dedicated chain and the control signal is controlled desirably from the outside so that the states of the registers can be monitored. Thus, inspection including the power control function or the power-off function of the LSI can be performed.

DESCRIPTION OF THE PREFERRED EMBODIMENTS

Best modes for carrying out the invention will be described below with reference to the drawings.

Embodiment 1

Figure 1:
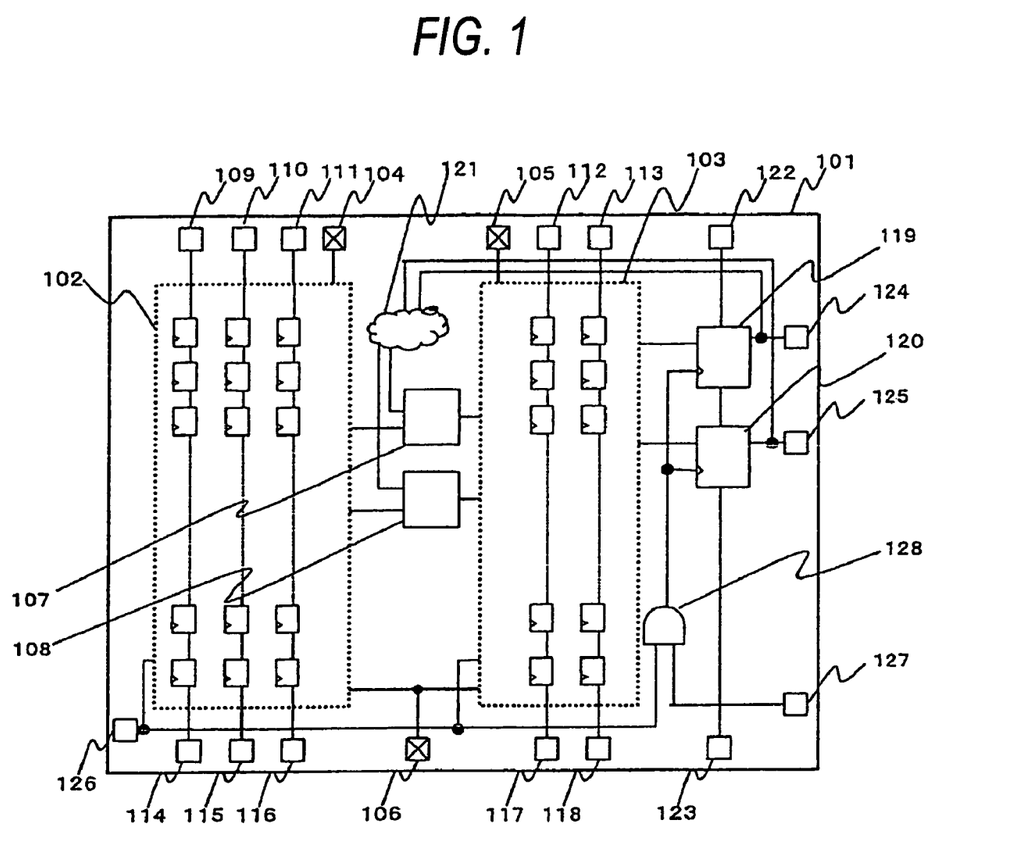
FIG. 1 is a block diagram showing the schematic configuration of an LSI having a power control function or a power-off function in Embodiment 1 of the invention.

FIG. 1 is a block diagram showing an LSI according to Embodiment 1 of the invention. In FIG. 1, the reference numeral 101 designates an LSI having a power control function or a power-off function; 102, a first block in the LSI 110; 103, a second block in the LSI 110; 104, a power terminal for supplying power to the first block 102; 105, a power terminal for supplying power to the second block 103; 106, a ground terminal of the LSI; 107 and 108, a first control circuit and a second control circuit for stabilizing exchange of signals with the first block 102 and the second block 103 supplied with different powers when the LSI 101 uses the power control function or the power-off function; 109 to 111, scan-in terminals for a structured test of a circuit of the first block 102; 112 and 113, scan-in terminals for the structured test of a circuit of the second block 103; 114 to 116, scan-out terminals for the structured test of the circuit of the first block 102; 117 and 118, scan-out terminals for the structured test of the circuit of the second block 103; 119 and 120, registers for determining the power control or power-off function; 121, a combinational circuit for propagating desired signal values to the first control circuit 107 and the second control circuit 108 based on the logic of the registers 119 and 120 for determining the power control or power-off function; 122, a scan-in terminal serving when the registers 119 and 120 for determining the power control or power-off function are made scannable as a dedicated chain; 123, a scan-out terminal serving when the registers 119 and 120 for determining the power control or power-off function are made scannable as the dedicated chain; 124 and 125, output terminals for outputting values of the registers 119 and 120 for determining the power control or power-off function; 126, a clock terminal serving during the structured test, 127, a clock control terminal to the registers 119 and 120 for determining the power control or power-off function; and 128, an AND circuit for suspending a clock to the registers 119 and 120 for determining the power control or power-off function, in accordance with a value of the clock control terminal.

During the structured test, the first block 102 and the second block 103 can be inspected by a scan path test. On this occasion, the registers 119 and 120 for determining the power control or power-off function are connected as another dedicated scan chain than that for the other registers.

Accordingly, the registers 119 and 120 for determining the power control or power-off function are controlled desirably from the outside. The AND circuit 128 is provided so that even when another flip-flop is performing a normal scan path test, data can be held and a clock can be suspended from the outside through the clock control terminal 127.

Figure 2:
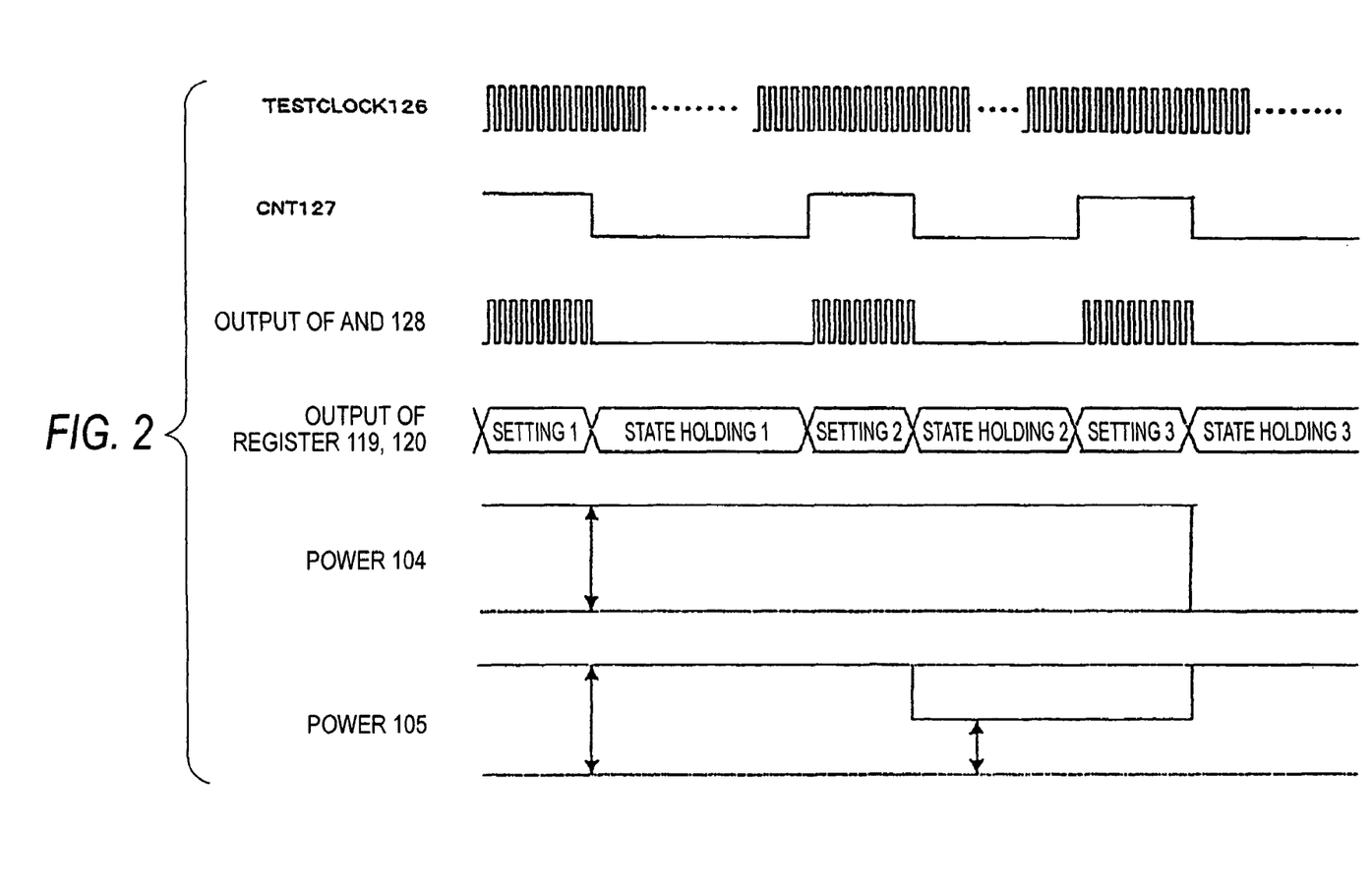
FIG. 2 is a timing chart showing the state of the LSI during a structured test in Embodiment 1 of the invention.

FIG. 2 is a timing chart showing the state of the LSI during the structured test in this embodiment. The structured test clock 126 is always inputted to registers other than the registers 119 and 120 for determining the power control or power-off function. In a section in which the clock control terminal 127 is "1", the clock is also put into the registers 119 and 120 for determining the power control or power-off function, and desired values are set in the registers 119 and 120 by a shift operation. When the clock control signal 127 is set at "0", the clock to the registers 119 and 120 for determining the power control or power-off function is suspended and values of the registers 119 and 120 are held. During the period, the LSI is set to a desired power control state or a desired power-off state logically. When inspection is performed in the condition that the power 104 and the power 105 are set at voltages in accordance with the values of the registers 119 and 120 in the section in which the values of the registers 119 and 120 are held, the inspection can be executed in the power control or power-off state.

Although the embodiment has been described on the assumption that the number of blocks, the number of power supplies and the number of registers for determining the power control or power-off function in the LSI 101 are set at 2, it is a matter of course that the invention is applicable to any number. In the timing chart according to the embodiment, the number of ways to set the registers 119 and 120 and the number of ways to hold the states of the registers 119 and 120 are three respectively. It is a matter of course that the invention is applicable to any number of ways to set and any number of ways to hold the states. When the clock can be suspended by the AND circuit 128, it is a matter of course that such control is also useful for any other circuit such as an OR circuit.

Embodiment 2

Figure 3:
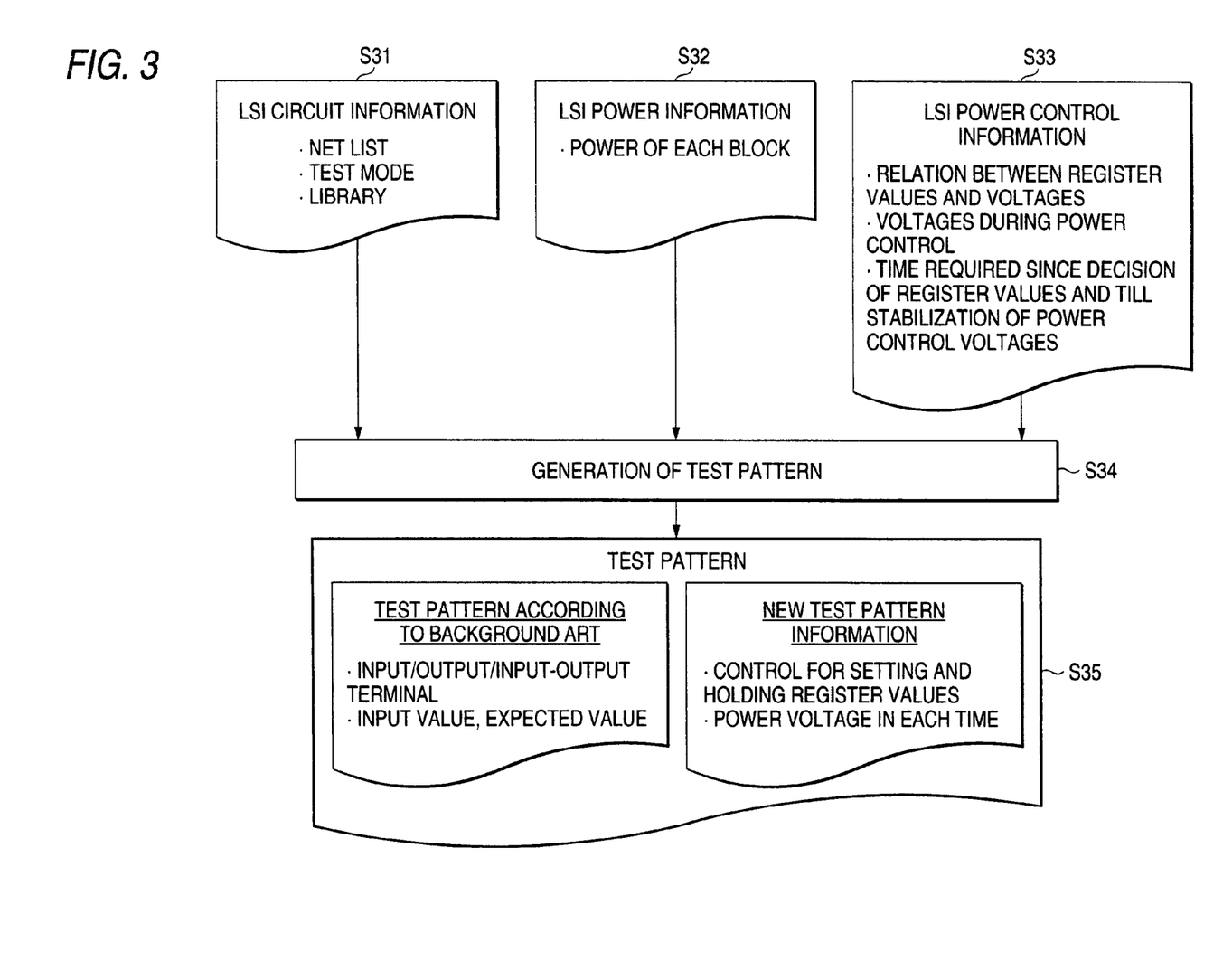
FIG. 3 is a flow chart showing a test pattern generating method for a scan path test in Embodiment 2 of the invention.

FIG. 3 is a flow chart showing a test pattern generating method for a scan path test in Embodiment 2 of the invention. Circuit information (S31) such as a net list, a test mode and a library is used for generating a test pattern in the background art. Here, not only the circuit information (31) but also LSI power information (S32) and LSI power control information (S33) are used for generating a test pattern (S34). The LSI power information (S32) includes information about power applied to each block, and so on. The LSI power control information (S33) includes the relation between register values of registers for determining a power control or power-off function and voltages, the voltages during power control, a time required since decision of the register values and till stabilization of the power control voltages, etc. In such a manner, as shown in the timing chart of FIG. 2, control is made to set and hold the register values of the registers so as to determine the power control or power-off function. Thus, information about power voltages in each time is obtained so that a test pattern capable of inspecting power-off or power control can be generated (S35).

Embodiment 3

Figure 4:
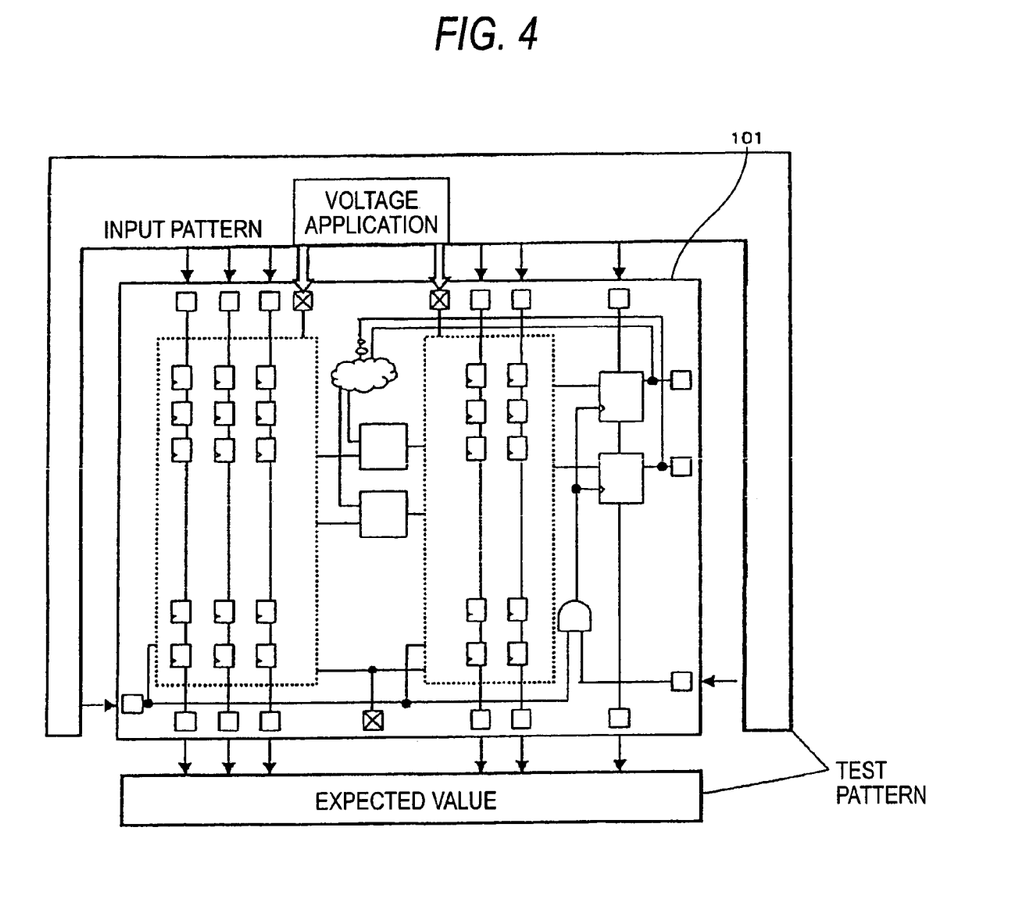
FIG. 4 is a block diagram showing a method for inspecting an LSI having a power control function or a power-off function in Embodiment 3 of the invention.

FIG. 4 shows a block diagram showing a method for inspecting an LSI with a power control function or a power-off function in Embodiment 3 of the invention. As shown in FIG. 4, a test pattern is roughly classified into an input pattern and an expected value. The input pattern includes information about power voltages. In this manner, the test pattern capable of inspecting the power-off or power control is used to inspect an LSI while the power to each block is controlled. Thus, inspection of the LSI can be executed in the power control or power-off state.

Embodiment 4

Figure 5:
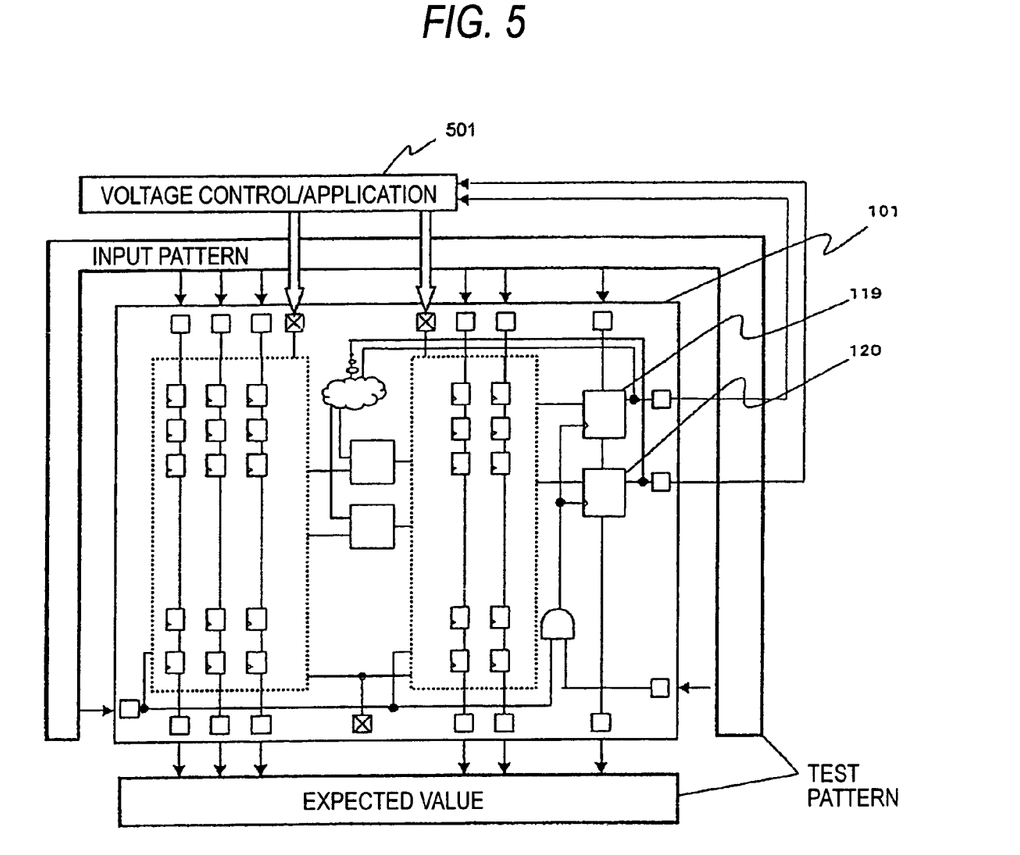
FIG. 5 is a block diagram showing a method for inspecting of an LSI having a power control function or a power-off function in Embodiment 4 of the invention.

FIG. 5 is a block diagram showing a method for inspecting an LSI in Embodiment 4 of the invention. In FIG. 5, a mechanism 501 is provided for controlling and applying voltages in accordance with outputs from registers 119 and 120 for determining the power control or power-off function. In this manner, even when information about power supplies etc. is absent from a test pattern, inspection can be performed while supplying power from moment to moment in accordance with register values, that is, in accordance with power control information requested by the LSI.

Embodiment 5

Figure 6:
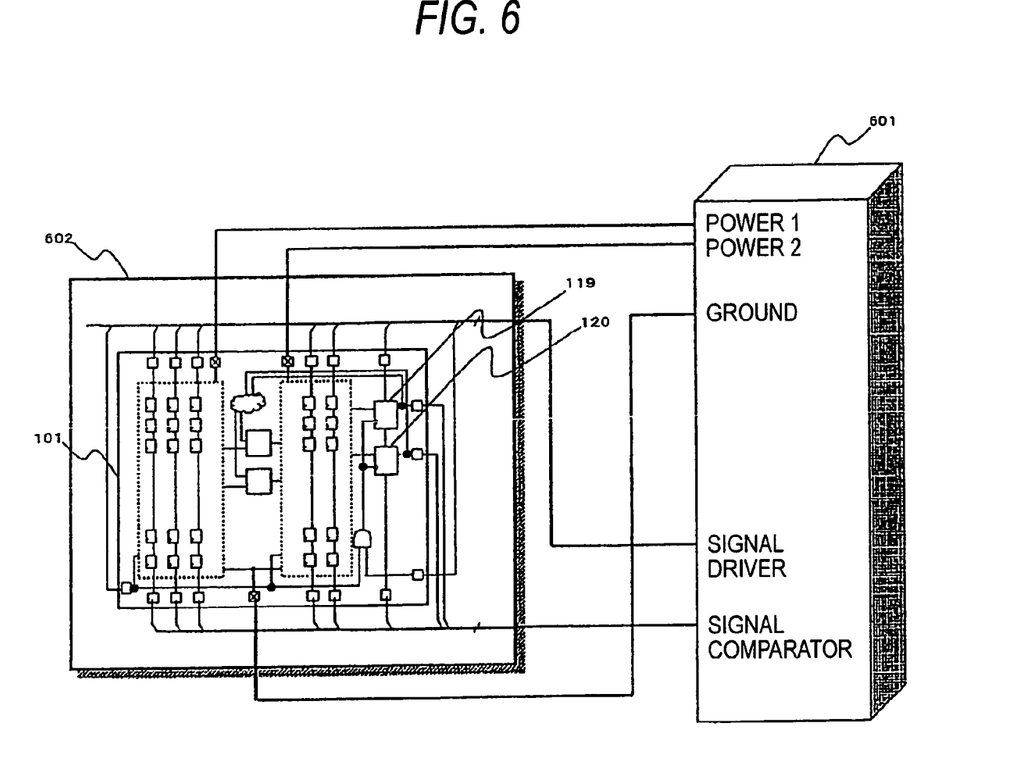
FIG. 6 is a block diagram showing inspection when power is supplied from an LSI inspection apparatus in Embodiment 5 of the invention.

FIG. 6 is a block diagram showing a method for inspecting an LSI in Embodiment 5 of the invention. In FIG. 6, the reference numeral 601 designates an LSI inspecting apparatus; and 602, an inspection board for measuring an LSI 101 by the LSI inspection apparatus 601. Signals are input to the LSI 101 from a signal driver of the LSI inspection apparatus 601, and signal outputs of the LSI 101 are compared by a signal comparator of the LSI inspection apparatus 601. Power is supplied from the LSI inspection apparatus 601 to the LSI 101 while a ground is connected to the LSI inspection apparatus 601. Values of the registers 119 and 120 for determining the power control or power-off function are output from the LSI 101 and judged by the LSI inspection apparatus 601. Voltages are supplied from the LSI inspection apparatus 601 in accordance with the signal values. In this manner, inspection in the mode of the power control function or the power-off function during a structured test can be performed by the LSI inspection apparatus 601.

Embodiment 6

Figure 7:
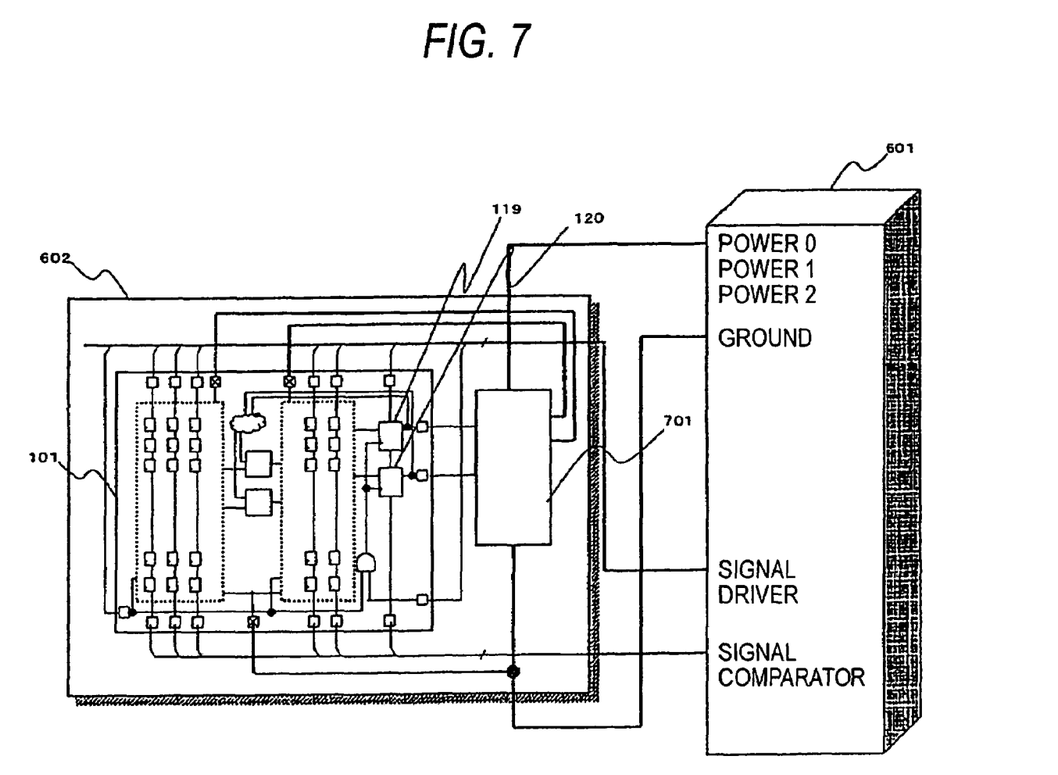
FIG. 7 is a block diagram showing inspection when power is supplied from a power supply module mounted on an inspection board in Embodiment 6 of the invention.

FIG. 7 is a block diagram showing a method for inspecting an LSI in Embodiment 6 of the invention. In FIG. 7, the reference numeral 701 designates a power module. Here, the power module 701 is mounted on an inspection board 602 together with an LSI 101 and supplied with power from the LSI inspection apparatus 601. Power outputs from the power module 701 are supplied to the LIS 101. Outputs of the registers 119 and 120 for determining the power control or power-off function are connected to the power module 701 so that desired power voltages can be supplied to the LSI 101 in accordance with the register values. Thus, inspection in the mode of the power control function or the power-off function during the structured test can be performed by the LSI inspection apparatus.

Although the embodiment has described on the case where outputs of the registers 119 and 120 for determining the power control or power-off function are imported to the power module 701 directly, it is a matter of course that information of the registers may be transmitted in the form of a sequence of read/write signals etc. from the LSI 101 to the power module 701.

Embodiment 7

Figure 8:
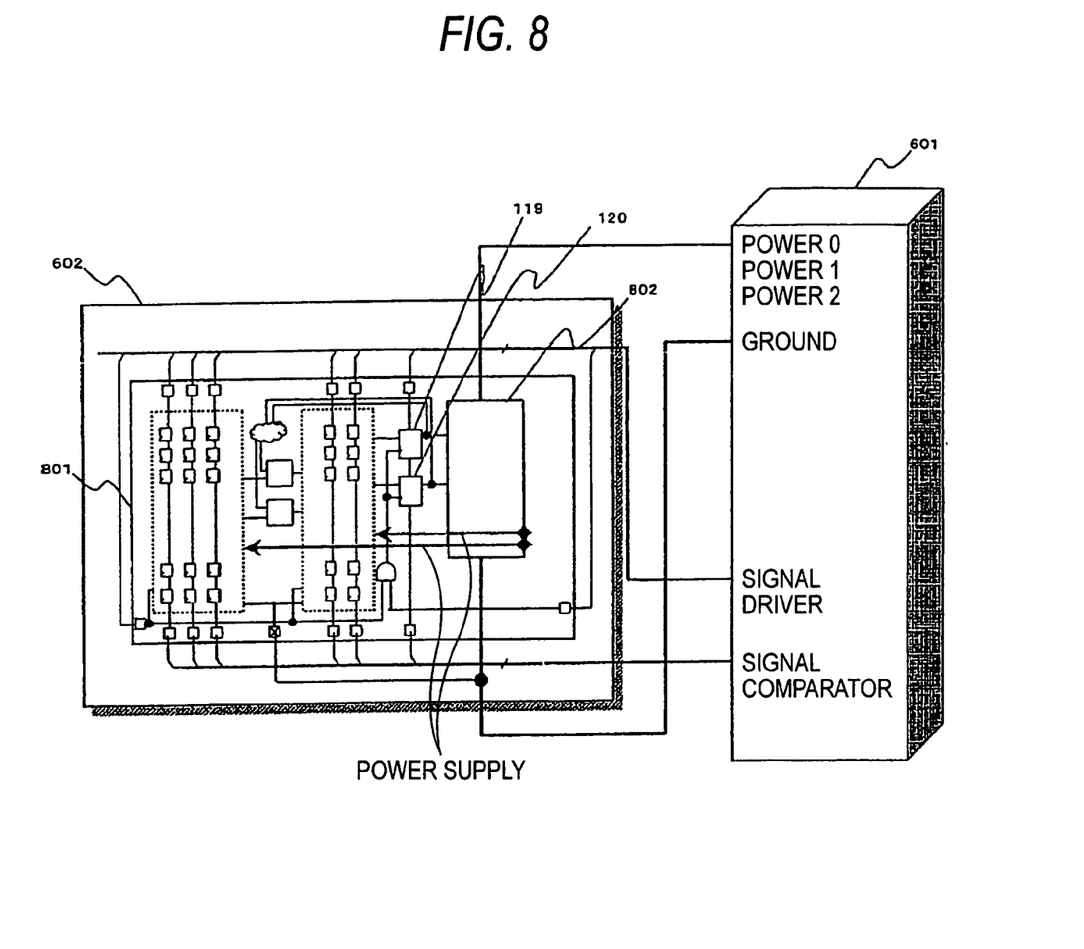
FIG. 8 is a block diagram showing inspection of an LSI provided with a power control module in Embodiment 7 of the invention.

FIG. 8 is a block diagram showing an LSI in Embodiment 7 of the invention. In FIG. 7, the reference numeral 801 designates an LSI; and 802, a power control module included in the LSI 801. Outputs of registers 119 and 120 for determining a power control or power-off function are connected to the power control module 802 and desired power voltages are supplied to respective blocks in accordance with the register values. In this manner, the power control module 802 inside the LSI is controlled so that inspection in the mode of the power control function or the power-off function during a structured test can be performed.

Although the embodiment has been described on the assumption that power is supplied from the power control module 802 to the inside of the LSI 801 through the internal wiring of the LSI, the power wiring may be led to the outside of the LSI 801 once and led to the inside of the LSI 801 again through external wiring so as to supply power to respective blocks.

Although the embodiment has been described on the assumption that outputs of the registers 119 and 120 for determining the power control or power-off function are imported directly to the power control module 802, it is a matter of course that information of the registers may be transmitted in the form of a sequence of read/write signals etc. from the LSI 101 to the power module.

Embodiment 8

Figure 9:
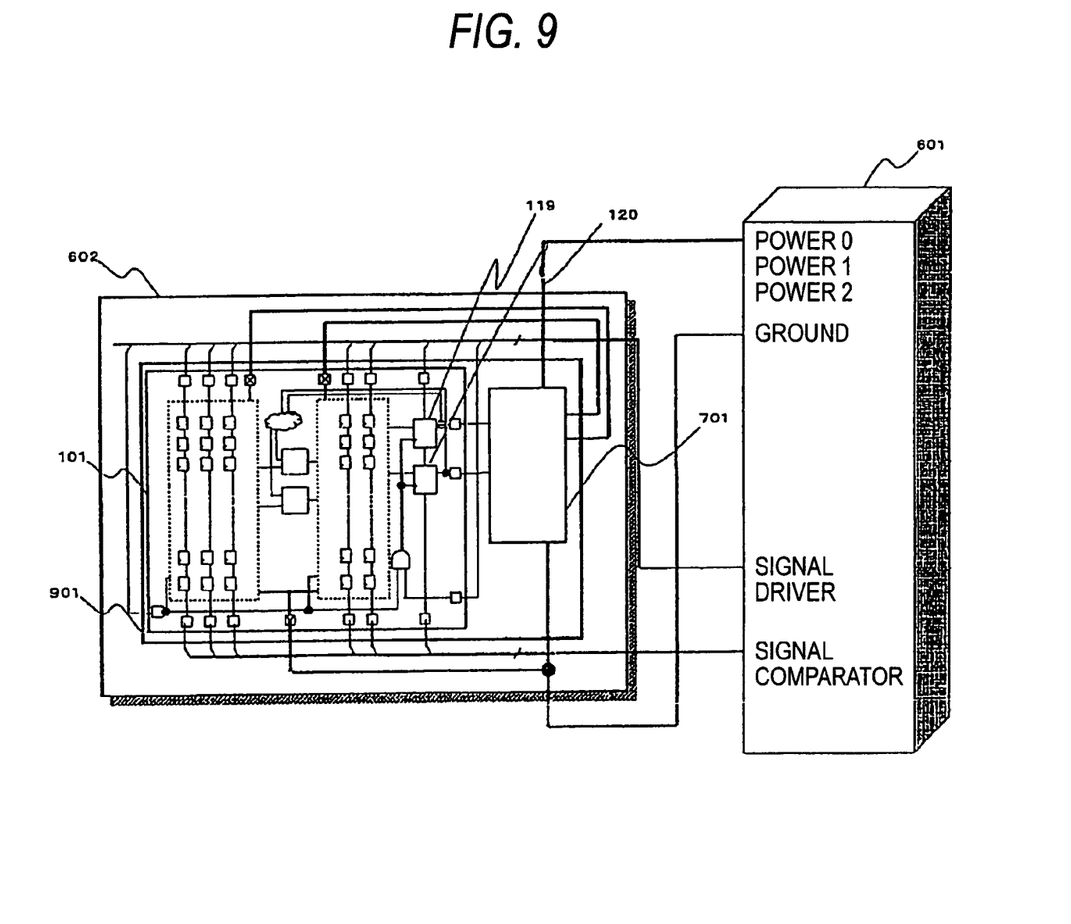
FIG. 9 is a block diagram showing inspection of a multichip module in Embodiment 8 of the invention.

FIG. 9 is a block diagram showing a multichip module in Embodiment 8 of the invention. In FIG. 9, the reference numeral 901 designates a multichip module in the embodiment. In the multichip module 901, the LSI 101 and the power supply module 701 are mounted on one and the same package. Outputs of registers 119 and 120 for determining a power control or power-off function of the LSI 101 are connected to the power supply module 701 and power to be supplied is connected from the power supply module 701 to power terminals of the LSI 101.

Accordingly, the LSI 101 and the power supply module 701 can performs operation similar to that in Embodiment 7. Thus, it is possible to provide a multichip module 901 in which inspection using the power control function or the power-off function of the LSI can be performed while the power supply module 701 is controlled.

Although the embodiment has been described on the assumption that the multichip module 901 is constituted only by the LSI 101 and the power supply module 701, it is a matter of course that the invention is applicable to a multichip module including another LSI or another module.

In the LSI, the method for generating the test pattern and the method for inspecting the LSI according to the invention, the registers for the power control or power-off signals are set as a dedicated chain and a control signal can be controlled desirably from the outside so that the states of the registers can be monitored easily. Accordingly, the structured test can be used for inspection of the LSI having the power control function or the power-off function so that inspection can be performed while desired power control or power-off is performed. Thus, preparation for inspection of the power control function or power-off function which was required in the background art can be dispensed with.

What is claimed is:

1. An LSI having a power control function or a power-off function, comprising:
    power terminals;
    ground terminals;
    registers, connected as a scan chain and capable of holding power control information;
    a gate circuit, capable of controlling a clock signal to be supplied to the registers;
    a clock control terminal capable of inputting a control signal for controlling the gate circuit;
    scan-in terminals capable of inputting scan signals; and
    scan-out terminals capable of outputting the scan signals; wherein:
    the control signal is supplied from the outside and the scan signals are monitored during a structured test.

2. The LSI according to claim 1, further comprising:
    a power control module for power control or power-off; wherein:
    the LSI can be inspected in a power control state or a power-off state by controlling the power control module during the structured test.

3. A method for inspecting an LSI including power terminals, ground terminals, registers connected as a scan chain and capable of holding power control information, a gate circuit capable of controlling a clock signal to be supplied to the registers, a clock control terminal capable of inputting a control signal for controlling the gate circuit, scan-in terminals capable of inputting scan signals, and scan-out terminals capable of outputting the scan signals; the method comprising the step of:
    inspecting the LSI in a power control state or a power-off state on the basis of a test pattern for inspecting a power control function or a power-off function of the LSI.

4. The method for inspecting an LSI according to claim 3, wherein the LSI is inspected by detecting an expected value corresponding to the power control information during a structured test.

5. The method for inspecting an LSI according to claim 4, including an LSI inspection apparatus having:
    a power supply connected to the power terminals and the ground terminals so as to be capable of supplying power to the LSI;
    a signal driver connected to the scan-in terminals so as to be capable of supplying the scan signals to the scan-in terminals; and
    a signal comparator connected to the scan-out terminals so as to be capable of detecting the scan signals from the scan-out terminals.

6. The method for inspecting an LSI according to claim 4, including:
    a power supply module connected to the power terminals and the ground terminals so as to be capable of supplying power to the LSI;
    an LSI inspection board mounted with the power supply module and the LSI; and
    an LSI inspection apparatus having a power supply capable of supplying power to the power supply module, a signal driver connected to the scan-in terminals so as to be capable of supplying the scan signals to the scan-in terminals, and a signal comparator connected to the scan-out terminals so as to be capable of detecting the scan signals from the scan-out terminals.

7. A multichip module, comprising:
    an LSI having power terminals;
    ground terminal;
    registers connected as a scan chain and capable of holding power control information;
    a gate circuit capable of controlling a clock signal to be supplied to the registers;
    a clock control terminal capable of inputting a control signal for controlling the gate circuit;
    scan-in terminals capable of inputting scan signals; and
    scan-out terminals capable of outputting the scan signals;
    a power supply module for performing power control or power-off on the LSI; and
    a package on which the LSI and the power supply module are mounted;
    wherein the LSI can be inspected in a power control state or a power-off state by controlling the power supply module in the multichip module during a structured test.

* * * * *